United States Patent
Wang

(10) Patent No.: US 7,265,611 B2
(45) Date of Patent: Sep. 4, 2007

(54) SELF ZEROING FOR CRITICAL, CONTINUOUS-TIME APPLICATIONS

(75) Inventor: Zhenhua Wang, Zürich (CH)

(73) Assignee: NXP B.V., Eindhoven (NL)

( * ) Notice: Subject to any disclaimer, the term of this patent is extended or adjusted under 35 U.S.C. 154(b) by 155 days.

(21) Appl. No.: 10/545,095

(22) PCT Filed: Jan. 28, 2004

(86) PCT No.: PCT/IB2004/000318

§ 371 (c)(1),
(2), (4) Date: Aug. 8, 2005

(87) PCT Pub. No.: WO2004/073163

PCT Pub. Date: Aug. 8, 2005

(65) Prior Publication Data

US 2006/0244520 A1    Nov. 2, 2006

(30) Foreign Application Priority Data

Feb. 11, 2003  (EP) ................................. 03100281

(51) Int. Cl.
*H03F 1/02* (2006.01)

(52) U.S. Cl. .............................. 330/9; 330/2; 327/307; 327/124

(58) Field of Classification Search .................... 330/9, 330/2; 327/307, 124
See application file for complete search history.

(56) References Cited

U.S. PATENT DOCUMENTS

| | | | |
|---|---|---|---|
| 5,061,900 A * | 10/1991 | Vinn et al. ...................... 330/9 |
| 5,397,944 A | 3/1995 | DuPuis | |
| 5,589,785 A * | 12/1996 | Garavan ...................... 327/63 |
| 6,191,715 B1 * | 2/2001 | Fowers ...................... 341/120 |
| 6,242,974 B1 * | 6/2001 | Kunst ............................. 330/9 |
| 6,316,992 B1 * | 11/2001 | Miao et al. .................... 330/2 |
| 6,724,248 B2 * | 4/2004 | Llewellyn ...................... 330/9 |

* cited by examiner

*Primary Examiner*—Patricia Nguyen

(57) ABSTRACT

Apparatus (1) for continuous-time application, comprising an operational amplifier (2) and a self-zeroing control unit (3) for reducing an offset of the operational amplifier (2). The self-zeroing control unit (3) provides for a self zeroing operation mode and a normal operation mode. It comprises a comparator (6), a successive approximation register (7), and a digital-to-analog converter (8).

14 Claims, 6 Drawing Sheets

SELF ZEROING FOR CRITICAL, CONTINUOUS-TIME APPLICATIONS

The present invention concerns apparatus and integrated circuits for continuous-time applications where the offset of at least one operational amplifier is compensated by a dedicated circuitry. The present invention also concerns a method for offset compensation.

Integrated circuits quite often require operational amplifiers. These amplifiers are typically employed to process signals such as amplification, filtering, etc. Depending on the application for which the integrated circuit is being used, the voltage offset of the operational amplifiers may have a detrimental impact on the circuit's performance.

The internal offset voltage has long been a serious problem with CMOS operational amplifiers, and large internal offsets can not be tolerated in precision applications, for instance. The difficulty in offset reduction lies at the fact that this offset is a random quantity, as well, and it not only depends strongly on the matching of the used devices, but also varies with temperature, supply voltage, and so forth. Moreover, the systematic offset is also subject to process variations.

For critical continuous-time applications, so far, low-offset design must rely on large transistor sizes leading to a high current consumption, or on very expensive post-trimming. It is thus obvious that all these known approaches are very limited.

Some known techniques such as chopper and auto zero are more effective, but can not be applied to continuous-time applications, because they are time discrete.

There is a need for low-offset operational amplifiers for telecommunication applications such as channel filters, smooth filters, anti-aliasing filters, automated gain control (AGC), high precision measurement systems, and so forth.

A scheme for offset calibration of operational amplifiers is described in U.S. Pat. No. 5,397,944. The offset calibration proposed in this US patent requires the respective operational amplifier to be in an open loop circuit. A plurality of switches is required that are used for the calibration only. It also requires a dedicated resistor accompanied by a switch both being used only for the compensation. Each of the amplifiers has associated with it a calibration logic which includes a ripper counter and a digital-to analog converter (DAC). The counter provides output signals to the DAC which in turn provides varying amounts of bias currents to a node inside the amplifier. The U.S. Pat. No. 5,397,944 embodies kind of a trial-and-error approach where the offset calibration is done step by step until the right bias current is found. It is a disadvantage of the scheme proposed in this US patent, that for a 6 bit DAC resolution, 64 clock cycles are required to complete the calibration. The circuit proposed suffers from supply and substrate noise, since one of the switches must be connected directly to the inverting input terminal of the operational amplifiers. This is a serious problem because the inverting input terminal of an operational amplifier is the most sensitive node in such an amplifiers. Due to this, the supply and substrate noise will degrade the circuit performance.

It is thus an objective of the present invention to provide a scheme for efficiently reducing the offset of operational amplifiers.

Accordingly, it is an object of the invention to provide an integrated circuit solution capable of automatically compensating a high range of offset components in an analog input signal of an operational amplifier while preserving the high precision.

It is a further object of the invention to provide an integrated circuit solution with reduced offsets at the operational amplifiers but without requiring a lot of circuit overhead.

An apparatus in accordance with the present invention is claimed in claim 1. Various advantageous embodiments are claimed in claims 2 through 8.

An integrated circuit in accordance with the present invention is claimed in claim 9. Various advantageous embodiments are claimed in claims 10 through 12.

A method in accordance with the present invention is claimed in claim 13. Various advantageous methods are claimed in claims 14 and 15.

Immediate benefits of this invention are improved reliability, flexibility, and competitiveness.

Other advantages of the present invention are addressed in connection with the detailed embodiments.

For a more complete description of the present invention and for further objects and advantages thereof, reference is made to the following description, taken in conjunction with the accompanying drawings, in which.

Figure 1:
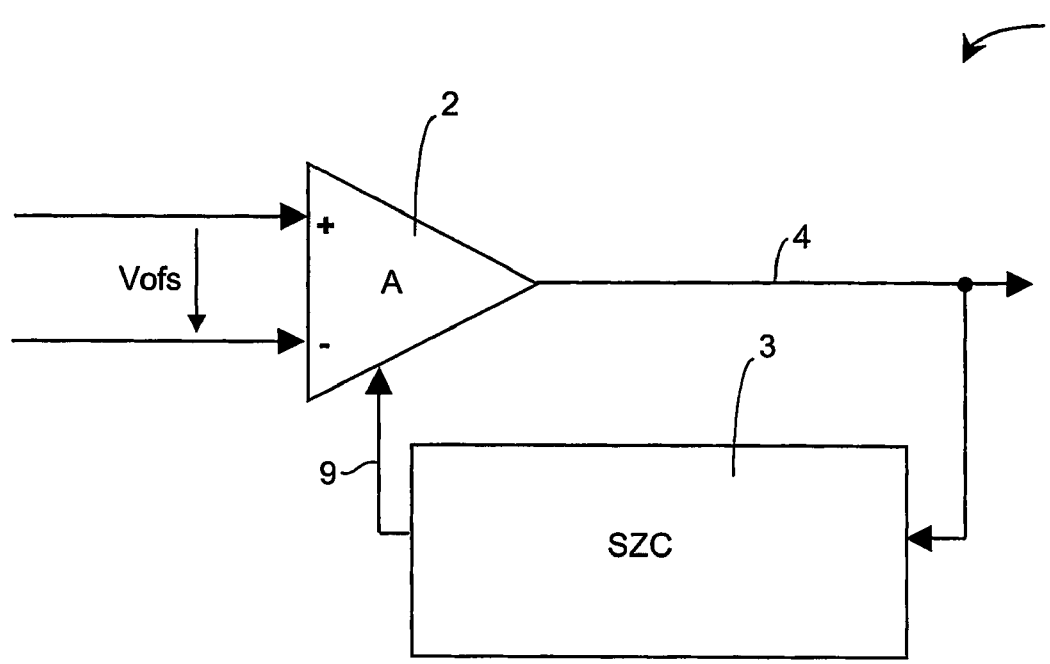
FIG. 1 is a schematic block diagram of a first apparatus, according to the present invention.

The present invention is based on the following principle. The key component that makes self zeroing possible for continuous-time applications is a self-zeroing control (SZC) unit 3 in connection with the operational amplifier 2 whose offset ($V_{ofs}$) has to be reduced or even cancelled (this process is hereinafter referred to as offset compensation). The basic block diagram of an apparatus 1 with self zeroing, according to the present invention, is depicted in FIG. 1.

Since the various embodiments addressed herein are derived from the known successive approximation register analog-to-digital converter (SAR ADC) architecture, this architecture is briefly addressed.

Figure 2:
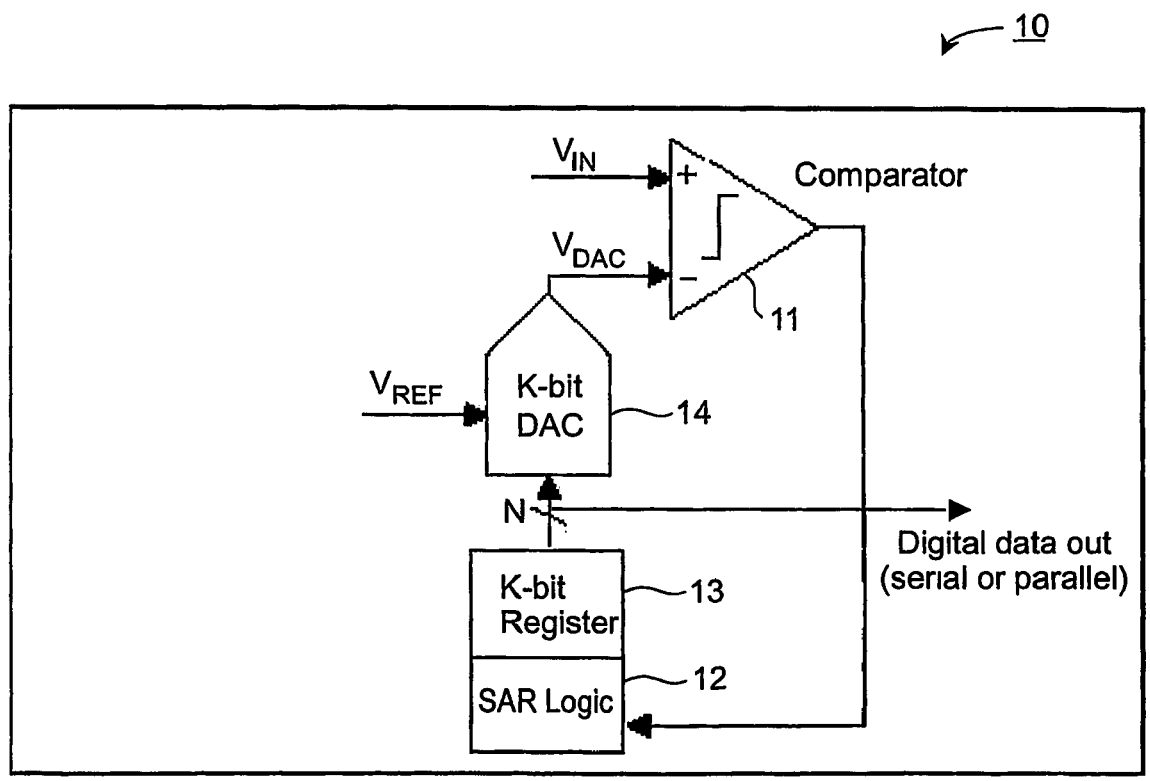
FIG. 2 is a schematic block diagram of a conventional successive approximation register analog-to-digital converter (SAR ADC)

Although there are many variations in the implementation of a SAR ADC 10, the basic architecture is quite simple (see FIG. 2). An analog input voltage (VIN) is applied to one input of a comparator 11 and a reference voltage VREF is provided to an K-bit digital-to-analog converter (DAC) 14. A comparison is then performed to determine if VIN is less than or greater than the voltage VDAC at the output of he DAC 14. If VIN is greater than VDAC, the comparator output is a logic high or '1' and the most significant bit (MSB) of the K-bit register remains at '1'. Conversely, if VIN is smaller than VDAC, the comparator output is a logic low and the MSB of the K-bit register 13 is cleared to logic '0'. A SAR control logic 12 is provided that then moves to the next bit down, forces that bit high, and does another comparison. The sequence continues all the way down to the least significant bit (LSB). Once this is done, the conversion is complete, and an K-bit digital word is available in the K-bit register 13.

Figure 3:
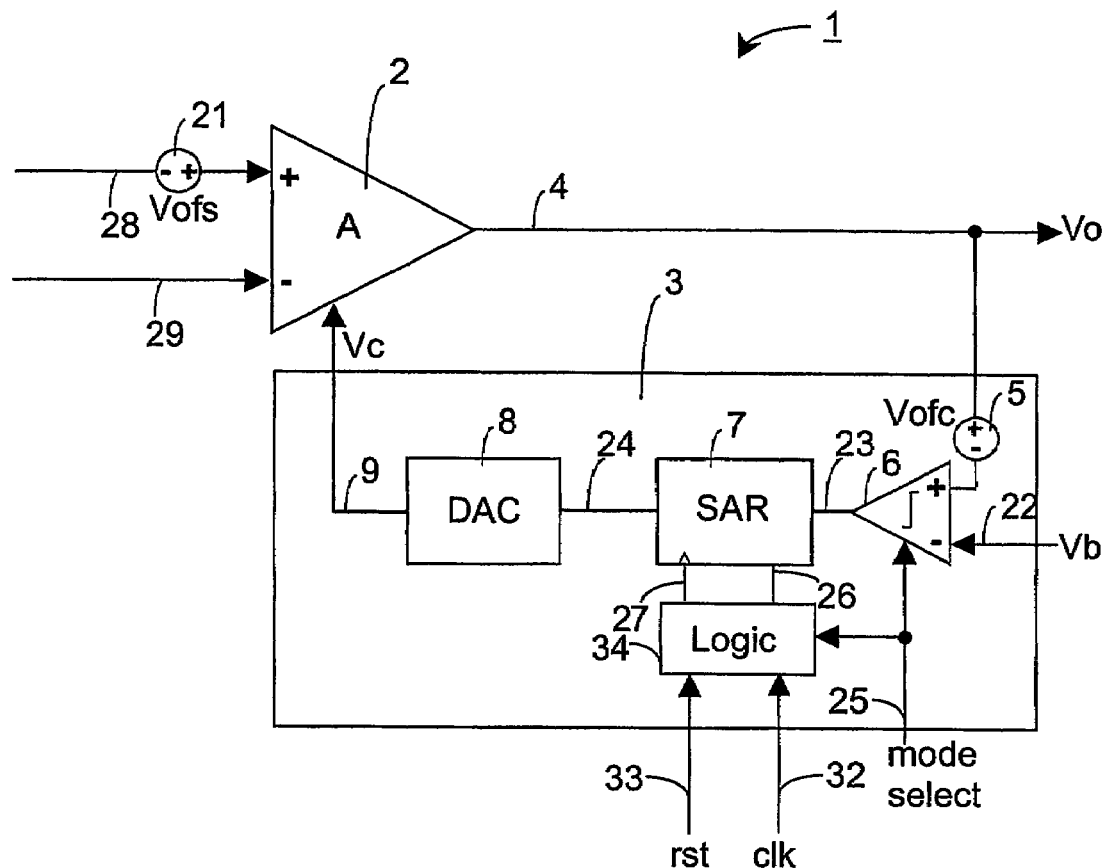
FIG. 3 is a schematic block diagram of a second apparatus, according to the present invention.
Figure 4:
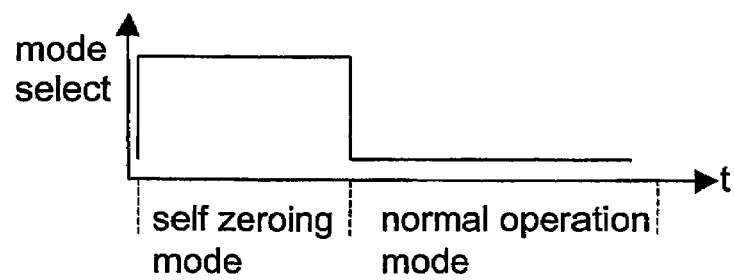
FIG. 4 is a schematic representation of the mode select signal, according to the present invention.

Turning now to FIG. 3, the basic principles of a SZC unit 3, according to present invention, are addressed. The SZC unit 3 comprises a comparator 6, a successive approximation register (SAR) 7, and a digital-to-analog converter (DAC) 8. Preferably, all these units 6 through 8 are standard circuit elements (standard library cells). The apparatus 1 has at least two basic modes of operation: (1) self zeroing mode and (2) normal operation mode. The mode of operation may be controlled by a mode select signal (e.g., a operational amplifier select signal that is suited to select one out of a plurality of operational amplifiers). One possible relation between the mode select signal and the two modes (1) and (2) is depicted in FIG. 4. Normally, the apparatus 1 first enters the self zeroing mode (1) after a power on event. The apparatus may be implemented so that an update is possible from time to time. In case of an update, the self zeroing mode (1) is entered temporarily before returning to the normal mode of operation (2).

At the core of the SZC unit 3 is the SAR 7, which controls the entire self zeroing process. The SAR 7 here works in a very similar manner as a conventional and well known SAR ADC 10, that was briefly addressed above. However, some major differences are worth mentioning. While in a SAR ADC 10 (cf. FIG. 2), the DAC output signal of the DAC 14 is fed back to one input of the comparator 11, the output 9 of the DAC 8 in FIG. 3 is applied to one node of the operational amplifier 2 on which the self zeroing is to be performed. Also, in a SAR ADC 10, the other input of the comparator 11 is the analog signal VIN to be converted to digital, while in FIG. 3 this input 28 is connected to a DC voltage Vb during the self zeroing mode (1). Vb may be a voltage that is set to midrail, i.e., Vb=(Vdd+Vss)/2. It should be noted that Vo=Vb if the inputs 28 and 29 of the operational amplifier 2 are short circuited and if the operational amplifier 2 is free of offset (i.e., Vofs=0). While in a SAR ADC 10 the output voltage of the DAC 14 at the end of each conversion step is the closest reproduction of the analog input voltage VIN (via both ADC and DAC), in the present system neither the value nor the polarity of the offset at the inputs 28, 29 can be predicted. The voltage Vc at the output 9 is thus not predictable either. For convenience, a known polarity is assigned to the offset voltage Vofs throughout this description.

The SAR 7 has an input 23 for receiving an analog input signal from the comparator 6 and an output 24 at which a digital output signal representing the value of the analog input signal is made available at a selected time. The SAR 7 performs an analog to digital conversion. The digital output signal is fed to the DAC 8. The DAC 8 (also known as D/A converter) is an electronic circuit that converts the digital representation of the quantity at the SAR's output 24 into a discrete analog value. The input signal to the DAC 8 is a digital binary code, and this code, along with a known reference voltage, results in a voltage Vc or current at the DAC output 9. By increasing the resolution of the DAC 9, the number of discrete steps can be increased and the step size can be reduced (which reduces the quantization error), resulting in a signal that closer approximates a continuous time signal. That is, the DAC 8 provides at its output 9 an analog output voltage Vc (or in some embodiments an analog output current) representing the offset at the operational amplifier that is to be compensated. The DAC 8 receives a sequence of digital signals generated by the SAR 7 at successive times and provides in response to each digital signal of the sequence the output voltage Vc corresponding to said digital signal. The DAC 8 converts the digital input signal having N bits to a substantially equivalent analog output voltage Vc.

In the present embodiment, the SZC 3 comprises a logic unit 34 that is designed to generate a clock signal and a reset signal for the SAR 7. This clock signal is applied to an input 27 and this reset signal is applied to an input 26. These two signals are generated by the logic unit 34 by combining the input signals clk, rst and mode select, which are fed to the unit 34 via the inputs 32, 33, and 25. The unit 34 may comprise two AND gates for example.

The self zeroing process is considered to be completed when all N bits have been decided by the SAR 7. Then, the apparatus 1 is ready for the normal operation mode (2). It can be shown that for a properly designed apparatus 1 and an K-bit DAC 8, a residual error remains, given roughly by equation (A):

$$|\varepsilon| \leq \frac{\Lambda}{2^{N+1}} + \left|\frac{Vofc}{A}\right| \quad (A)$$

where $\Lambda$ is the maximum input offset of the operational amplifier 2 prior to the self zeroing process, Vofc is the input offset of the comparator 6, and A is the DC gain of the operational amplifier 2. From the equation (A), this residual error $\epsilon$ can be reduced with an increase in the DAC's resolution and a lowering of the comparator's offset Vofc. The second term of equation (A) can be reduced to a negligible level if a chopper comparator is used as comparator 6, or if the gain A of the operational amplifier 2 is high enough.

Figure 5:
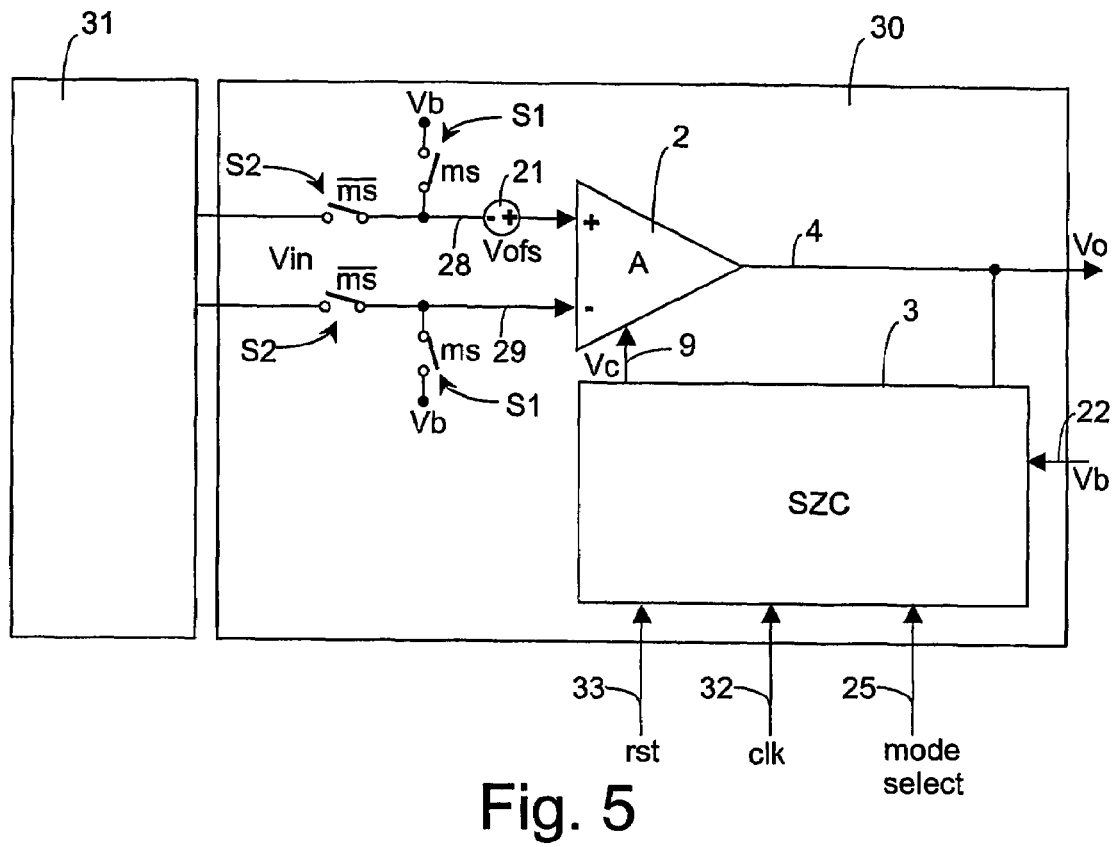
FIG. 5 is a schematic block diagram of a third apparatus, according to the present invention.
Figure 6:
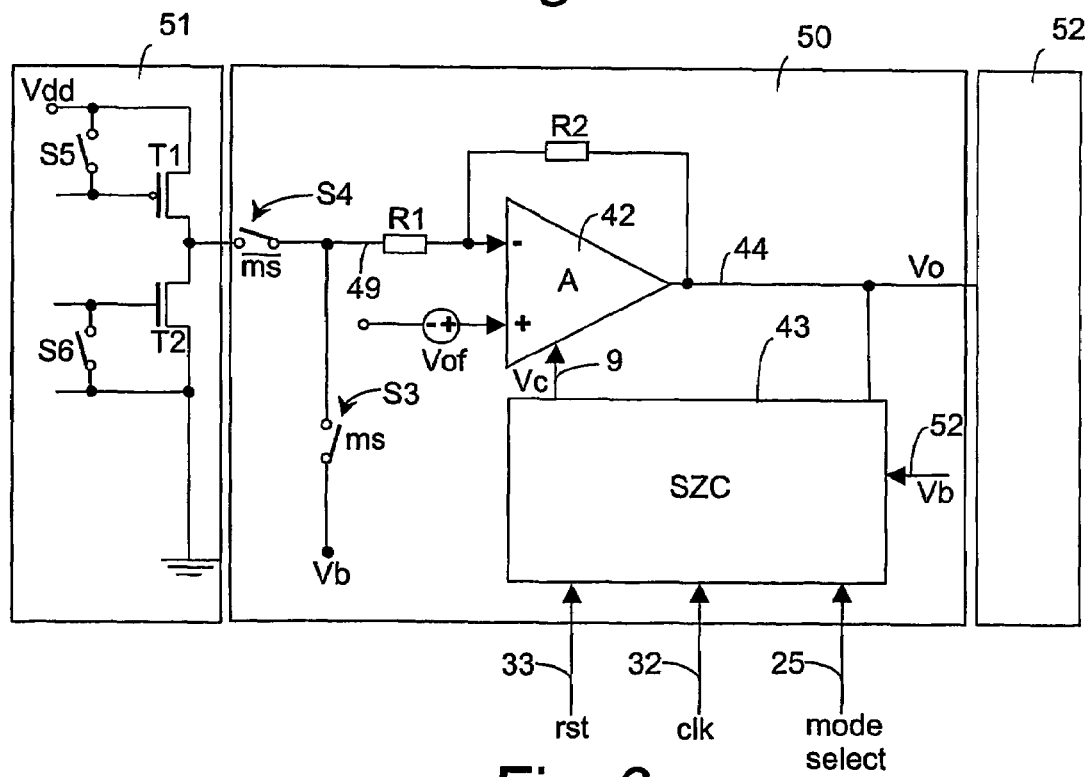
FIG. 6 is a schematic block diagram of a fourth apparatus, according to the present invention.

For precise self zeroing, the operational amplifier in the self zeroing mode (1) has to be isolated from its preceding stage. For this purpose, several switches S1 and S2 may be added to the embodiment of FIG. 3, as illustrated in FIG. 5. The mode select signal is in the present embodiment used to switch from the self zeroing mode (1) to the normal operation mode (2) and back. For this purpose, the mode select signal (ms) is applied to the switches S1 and the inverted mode select signal ($\overline{ms}$) is applied to the switches S2. If the mode select signal ms is logic "1" (cf. FIG. 4), the switches S1 are closed and the switches S2 are open. The apparatus 30 is decoupled (isolated) from any preceding stage 31 during the self zeroing mode (1). If the mode select signal ms is logic "0" (cf. FIG. 4), the switches S1 are open and the switches S2 are closed. In this case the apparatus 30 is in the normal operation mode (2). This apparatus 30 has, however, implications, which can best be explained in connection with an embodiment 50, illustrated in FIG. 6. Here only two switches S3 and S4 are needed at the input side of the operational amplifier 42. In the self zeroing mode (1), the switch S4 is open and the switch S3 is closed. After the self zeroing process, the switch S3 is open and S4 is closed. Due to the presence of the switch S4, the gain of this stage 50 is altered to:

$$A = \frac{R2}{R1 + RS4}, \quad (B)$$

where RS4 is the on-resistance of the switch S4. With large-size transistors, this effect can be reduced, but it is most desirable to eliminate during the normal operation mode (2) the switch S4 completely from the signal path between the preceding stage 51 and the stage 50, while still providing for the necessary isolation of the two stages 51 and 50 during the self zeroing mode (1). If the operational amplifier in the preceding stage 51 (not fully visible in FIG. 6) is not equipped with a power-down mode, the two switches S5 and S6 maybe added to the output transistors T1 and T2 at the output side of this operational amplifier, as depicted on the left hand side of FIG. 6. When the switches S5 and S6 are closed, both pMOS and nMOS output transistors T1 and T2 are turned off. The switch S3 is closed too, so that the input 49 of the operational amplifier 42 is connected to Vb. In this way, the isolation of the two stages 50, 51 is ensured during the self zeroing mode (1). During the normal mode of operation (2), the switches S3, S5 and S6 are all open, and there is no closed switch in the signal path. That is, there is thus no on-resistance of a switch that is to be considered. The term RS4 disappears from the equation (B) if one removes the switch S4 completely. This switch S4 can be removed, either if the preceding stage 51 is equipped with a power-down mode, or if the output transistors T1 and T2 are equipped with switches S5 and S6, as illustrated.

As mentioned above, the self zeroing process can be carried out upon power-on, or, if desired, at any time if an update is called for. The normal mode of operation (2) commences once the self zeroing process is completed. In order to safe power, the comparator 6, or 76, or 96, or 106 may be designed so that it turns off when the mode select signal ms is logic low.

As mentioned, the clock signal (clk) and the reset signal (rst) may be combined by a logic unit 34 comprising AND gates. If these two signals clk and rst are ANDed with the mode select signal ms before being applied to the inputs 26, 27 of the SAR 7, as shown in FIG. 3, the SAR 7 keeps its output states at the output 24 unchanged as long as the mode select signal ms is logic low. Upon completion of the self zeroing process, the only circuit element of the stage 1 that keeps running would be the DAC 8, which alone determines the power consumption of the SZC unit 3 during the normal mode of operation. This power saving feature is optional.

Figure 7:
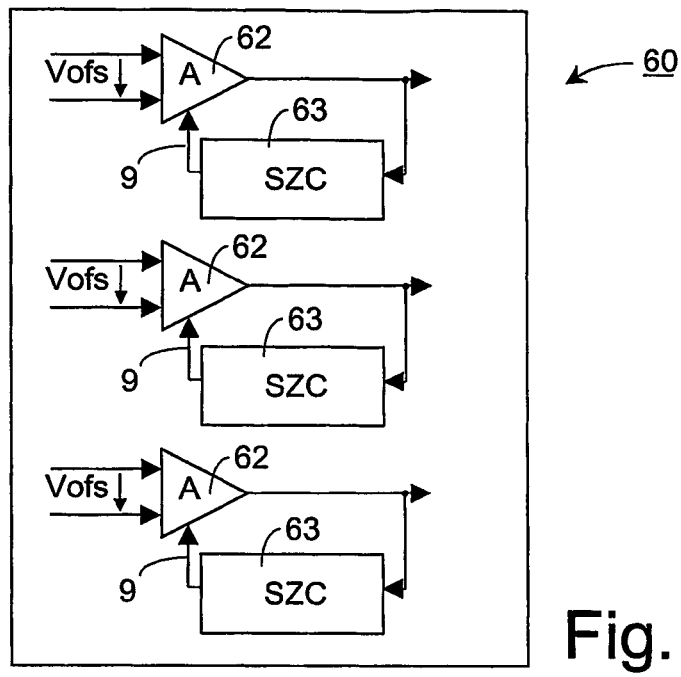
FIG. 7 is a schematic block diagram of a fifth apparatus, according to the present invention.

In the following, various self zeroing embodiments are addressed. On an integrated circuit (IC), e.g., a typical mixed-signal IC, there may be as many as a few dozens of operational amplifiers employed. Some of them are used for continuous-time applications and their input offset may be so critical that the specification can not be easily met without post-trimming, or self zeroing, as proposed herein. Then, the self zeroing has to be performed on all those critical operational amplifiers. If the number of operational amplifiers is N, a total of M=N SZC units has to be added, one to each of the critical operational amplifiers. This means that N comparators, N SARs, N DACs and so forth would be needed. In FIG. 7 an embodiment 60 with N=3 operational amplifiers 62 and M=3 SZC units 63 is depicted, that is N=M. This considerably adds to the overall overhead. It is therefore of importance how to use the resources efficiently in order to keep the overhead at a minimum. Different element sharing embodiments are addressed in the following sections.

In the present context, the strategy mainly aims at minimizing the overhead while preserving the high precision of the embodiments addressed so far. The basic idea is to let as few as possible common circuit elements be shared by as many operational amplifiers as possible. Another factor to be considered is the time (number of clock cycles) required for the self zeroing process. If a K-bit DAC is employed, for one stage the self zeroing takes K clock periods to complete. This statement is only true for an embodiment similar to the one depicted in FIG. 1, 3, 5, or 6, for instance. Due to the element sharing, it will take longer since the self zeroing will have to be performed somehow sequentially rather than simultaneously. The longer time needed for completion of the self zeroing process is not assumed to be a big issue and the main focus in the present context is the reduction of the area overhead. Three basic element sharing embodiments are addressed below.

Figure 8:
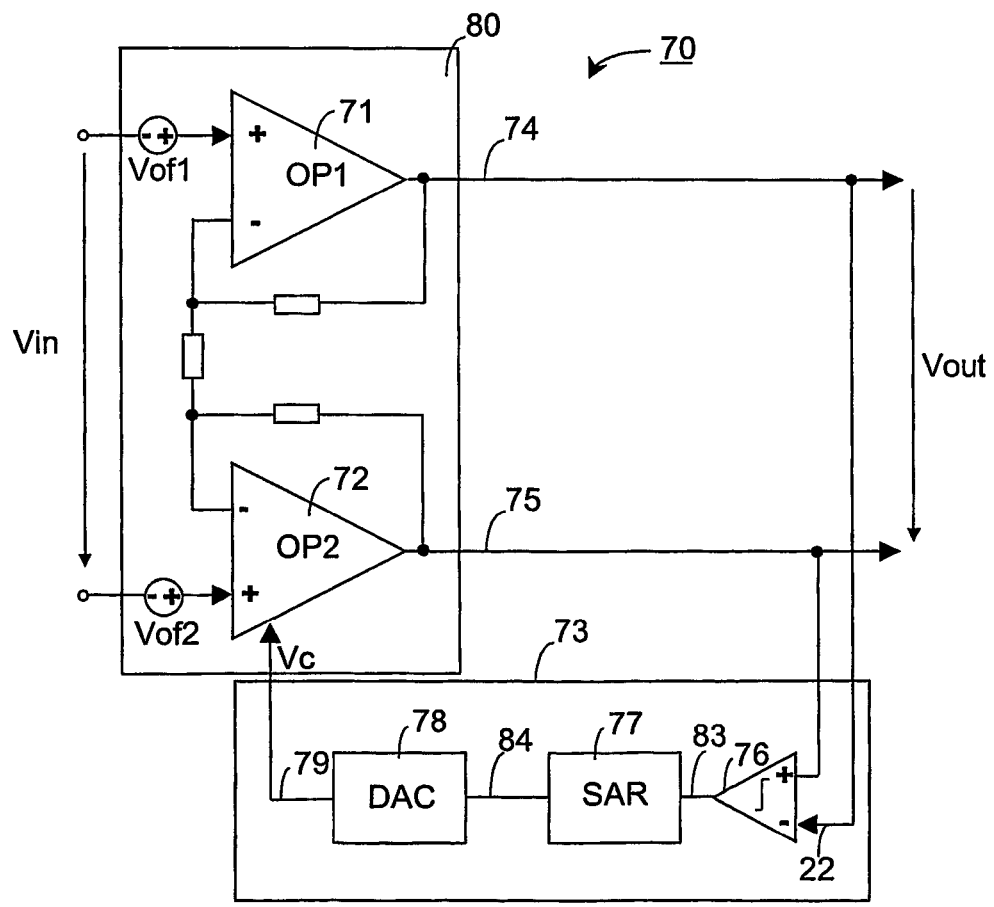
FIG. 8 is a schematic block diagram of a sixth apparatus, according to the present invention.

(I) Sharing a common SZC unit: In precision applications, it is often required for operational amplifiers to handle fully differential signals. This may be the case for example in an IC where a differential smoothing filter is required after the DAC part of a transmitter. Instead of a single fully differential operational amplifier, the IC 70 may comprise two conventional operational amplifiers 71, 72 (OP1 and OP2), as illustrated in FIG. 8. Because each operational amplifier 71, 72 has its own offset (Vof1 and Vof2, respectively), the resultant differential operational amplifier 80 is free of offset if both operational amplifiers 71, 72 have zero offset. In order to achieve this, M=2 SZC blocks would have to be added, one to each operational amplifier 71, 72 (as in FIG. 7). However, it is noted that the output offset becomes zero as long as Vof1=Vof2. This is permitted if both Vof1 and Vof2 are small and if the circuit meets all the requirements except the offset. Then only one SZC unit 73 is required, as illustrated in FIG. 8. The self zeroing voltage Vc can be applied to one of the two operational amplifiers (OP2 in FIG. 8) in order to cut the overhead to a half. In the present embodiment, the outputs 74 and 75 are coupled to the input side of the comparator 76, as illustrated.

Figure 9:
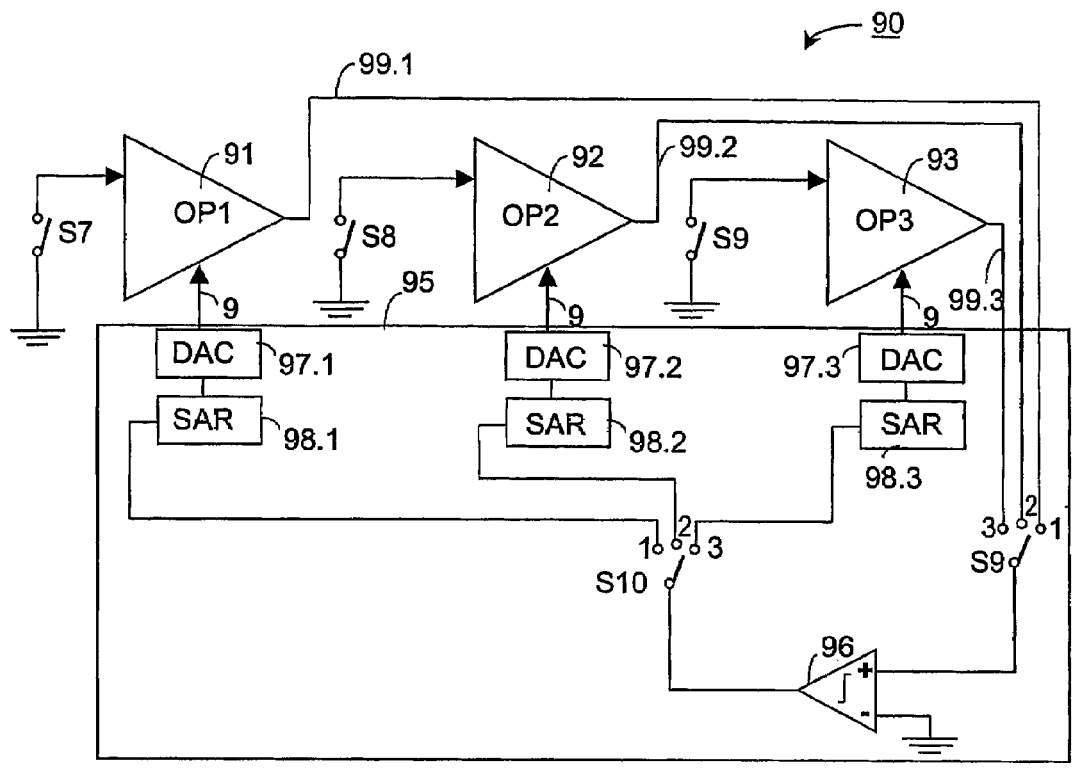
FIG. 9 is a schematic block diagram of a seventh apparatus, according to the present invention.

(II) Sharing a common comparator: In order to make the second term in the equation (A) negligible, the inherent offset of the comparator of the SZC unit has to be much lower than the quantization error of the SAR. This implies that the qualified comparator may occupy considerable silicon area of the IC. It is thus desirable to use just one comparator for some or for all operational amplifiers, especially if the number (N) of operational amplifiers is large. An embodiment 90 sharing a common comparator 96 is illustrated in FIG. 9 with N=3 and M=1. The SZC unit 95 comprises N=3 DACs 97.1 through 97.3 and N=3 SARs 98.1 through 98.3, but just one comparator 96. This embodiment can be expanded to any number N of operational amplifiers within an IC. The embodiment 90 comprises N=3 operational amplifiers 91 through 93. Here, all the operational amplifiers 91 through 93 share one common comparator 96. Due to the sharing, the self zeroing can only be performed on one amplifier stage at one time. To facilitate a stage-by-stage offset compensation, an input switch S10 and an output switch S9 are added. The isolation between two stages can be achieved as described above in connection with FIG. 5 or 6. In order to perform the self zeroing on the first operational amplifier 91 (OP1), for example, both switches S9 and S10 are put in position 1. If the switches S9 and S10 are in this position, a circuit is obtained that is similar to the one, shown in FIG. 1. For N operational amplifiers, the saving that can be achieved is N-1 comparators, if compared to the embodiment of FIG. 7. The FIG. 9 shows a general case in which all stages are not necessarily in cascade. Consequently, self zeroing is done for each operational amplifier 91 through 93 each time the comparator 96 is connected to the output terminal 99.1 through 99.3 of one operational amplifier 91 through 93, via the switch S9. If several operational amplifiers are connected in series, such as in a high order filter for example, such an arrangement is not suitable because the residual errors of each stage would accumulate. A solution to overcome this problem is described in connection with FIG. 10.

(III) Sharing both comparator and SAR: Even more saving can be accomplished if the SAR unit is shared among several operational amplifiers. The apparatus 100 in FIG. 10 makes this possible. The SZC unit 105 comprises N=3 DACs 107-109 and N=3 D-Latches 110-112, but just one SAR 104 and one comparator 106. In this embodiment, only the output 113 of the operational amplifier 103 is connected to one of the inputs of the comparator 106. The other input of the comparator 106 is connected to analog ground. Comparing it with the apparatus 90 of FIG. 9, the input switch S10 and output switch S9 are no longer needed here. For a simple discussion of the principle, one K-bit DAC 107 through 109 is assumed for each of the N=3 operational amplifiers 101 through 103. Because the SAR 104 is shared among all operational amplifiers 101 through 103, D-latches 110 through 112, whose truth table is given below, have to be inserted between the SAR 104 and the DACs 107 through 109 in order to store data.

Figure 10:
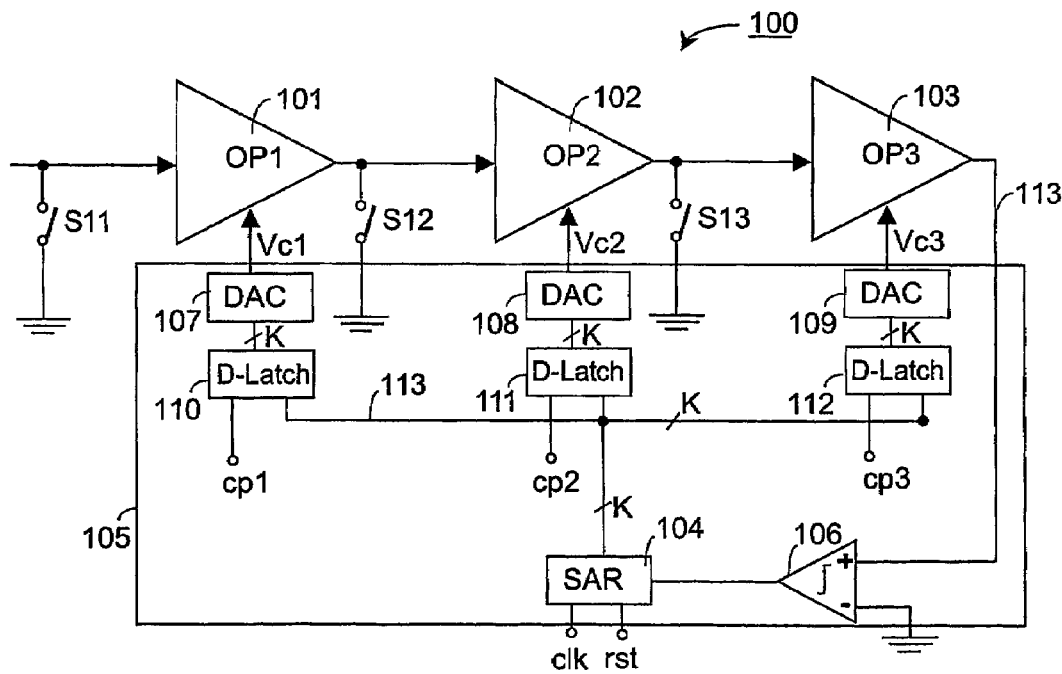
FIG. 10 is a schematic block diagram of an eighth apparatus, according to the present invention.

| Truth table of D-Latches in FIG. 10 | | |
|---|---|---|
| D | Cp | Q |
| L | H | L |
| H | H | H |
| X | L | Qo |

Preferably, the self zeroing process starts with the last operational amplifier 103 in the cascade and ends with the first operational amplifier 101. In order to compensate the 2nd operational amplifier in a chain of N=3 amplifiers, for example, the cp2 signal is set to be logic high (while all other signals cp1 and cp3 are logic low), and the input switch S12 is closed. With cp2 high, the added latch to the 2nd operational amplifier 102 is transparent, so that the output of the SAR 104 is directly applied to the DAC 108 of the 2nd operational amplifier. After the self zeroing of the 2nd stage, the cp2 goes logic low, and the output states of the latch 111 maintains until the next self zeroing on this operational amplifier 102 takes place. This strategy saves N-1 comparators as well as N-1 SARs and it stops the error accumulation of the residual errors of each amplifier stage. It is a disadvantage that N D-latches 110 through 112 and a K-bit wide data bus 113 are needed. The principle of FIG. 10 can be extended to any number (N) of operational amplifiers.

Figure 11:
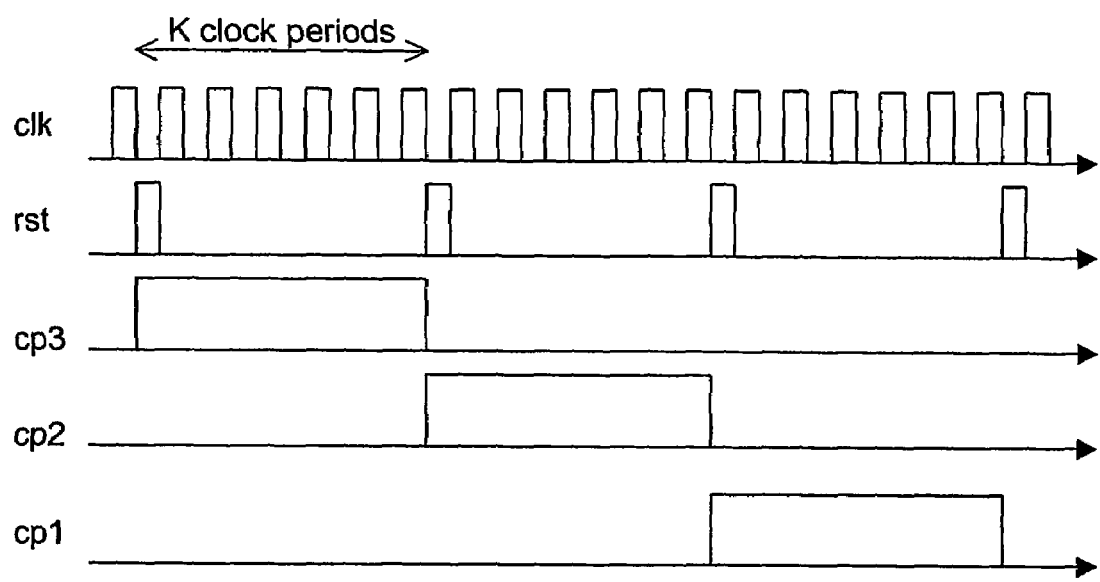
FIG. 11 is a schematic representation of some signals, according to the present invention.

Some important waveforms are shown in FIG. 11. These waveform can be used in connection with the apparatus 100 of FIG. 10. The FIG. 11 shows the signals clk, rst, cp1, cp2 and cp3.

While the strategy (I) takes only K clock cycles, the other two strategies (II) and (III) take N times K clock cycles. In order to reduce the required time, operational amplifiers can be grouped and for each group the best strategy can be chosen independently. This approach can yield best performance in terms of silicon area, required clock cycle time, and power consumption.

The architecture presented herein allows for high performance, low power circuits to be packaged in small form factors for today's demanding applications. It is well suited for filters, automated gain control circuits, and bandgap reference circuits.

It is a key issue that, according to the present invention, the zeroing is done automatically and independently from any control or management circuit. All that is required is some kind of mode select signal (e.g., ms) that "triggers" the self zeroing process for a particular operational amplifier.

A circuit technique was presented that permits self zeroing for continuous-time applications. With the techniques presented herein, the overhead can be kept at a minimum while a high precision is preserved.

It is an advantage of the present invention that it works with operational amplifiers in an open loop or in a closed loop. It is another advantage of the invention presented herein, that it take only very few clock cycles for the compensation process.

It is a further advantage of the present invention that it requires only very few modifications of an existing circuit when adding the self zeroing means. The present invention allows a high degree of circuit element sharing, as addressed in connection with the examples given in FIGS. 8 through 10. According to the present invention, it is for example possible to share the SAR, leading to reduced costs and smaller silicon area being occupied by the offset compensation means.

The present invention does not require a specially designed current DAC, like the offset calibration approach described in the U.S. Pat. No. 5,397,944. The scheme presented herein works for all kinds of DACs. The method presented herein can use a current or a voltage as a control signal (Vc) for the operational amplifier.

The present invention can be realized using standard library cells and there is thus no need for special circuits.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable sub combination.

In the drawings and specification there has been set forth preferred embodiments of the invention and, although specific terms are used, the description thus given uses terminology in a generic and descriptive sense only and not for purposes of limitation.

The invention claimed is:

1. Apparatus for continuous-time application, comprising an operational amplifier and a self-zeroing control unit for reducing an offset of the operational amplifier, said self-zeroing control unit providing for the following two modes of operation (a) self zeroing operation performing a self-zeroing process and (b) normal operation wherein the self-zeroing control unit comprises a comparator, a successive approximation register, and a digital-to-analog converter, wherein the offset of the operational amplifier is adjustable by a single-ended output voltage provided at an output of the digital-to-analog converter and applied to a node of the operational amplifier.

2. The apparatus of claim 1, wherein the self-zeroing control unit is switcheable between the two modes by a mode select signal (ms).

3. The apparatus of claim 1, comprising switching means allowing the operational amplifier during the self zeroing operation to be separated from a stage, that precedes the operational amplifier.

4. The apparatus of claim 1, wherein the comparator comprises a first input node and a second input node, the first input node being connected to an output of the operational amplifier and the second input node being connectable to a reference voltage or to analog ground.

5. The apparatus of claim 1, wherein the comparator is turned off when the mode select signal turns logic zero.

6. The apparatus of claim 3, wherein the switching means comprises switches being switchable by the mode select signal or the inverted mode select signal.

7. The apparatus of claim 1, wherein the comparator and preferably the successive approximation register are shared by two or more operational amplifiers.

8. Integrated circuit, preferably a mixed-signal integrated circuit, comprising a plurality N of operational amplifiers with excessive offsets that have to be reduced, and M self-zeroing control units for reducing an offset of the operational amplifiers, with N≧M, said self-zeroing control units providing for the following two modes of operation (c) self zeroing operation performing a self-zeroing process and (d) normal operation, whereby at least one of the M self-zeroing control units comprises a comparator, a successive approximation register, and a digital-to-analog converter, wherein the comparator is turned off when the mode select signal turns logic zero.

9. The integrated circuit of claim 8 with N=M.

10. The integrated circuit of claim 8 with M=1, whereby said self-zeroing control unit comprises one comparator, N successive approximation registers, and N digital-to-analog converters.

11. The integrated circuit of claim 8 with M=1, whereby said self-zeroing control unit comprises one comparator (106), one successive approximation register, N digital-to-analog converters; and N D-Latches.

12. Method for performing a self-zeroing process in an integrated circuit that comprises an operational amplifier with excessive offset that has to be reduced by the self-zeroing process, and a self-zeroing control unit for reducing the offset of the operational amplifier, said method comprising the steps: applying a mode select signal to the self-zeroing control unit, comparing an output signal of the operational amplifier with a reference voltage in order to provide a corresponding analog signal, providing the analog signal to an input of a successive approximation register in order for this analog signal to be transformed into a digital signal, said digital output signal representing the value of the analog signal, applying this digital signal to a digital-to-analog converter for generating a single-ended analog output signal, applying this analog output signal to a node of the operational amplifier.

13. Method of claim 12, whereby the operational amplifier is separated from a preceding stage of the integrated circuit when performing the self-zeroing process.

14. Method of claim 12, whereby the self-zeroing process is carried out after a power-on event.

* * * * *